United States Patent [19]

Chick

[11] Patent Number: 5,446,388
[45] Date of Patent: Aug. 29, 1995

[54] TOOL FOR PULLING AND TESTING CARTRIDGE-TYPE FUSES

[76] Inventor: Roy D. Chick, P.O. Box 32, Wheeler, Tex. 79096

[21] Appl. No.: 833,108

[22] Filed: Feb. 10, 1992

Related U.S. Application Data

[63] Continuation-in-part of Ser. No. 619,597, Nov. 29, 1990.

[51] Int. Cl.⁶ ............................................. G01R 27/26
[52] U.S. Cl. ...................................... 324/550; 324/507
[58] Field of Search ................ 324/133, 507, 508, 550

[56] References Cited

U.S. PATENT DOCUMENTS

| | | | |
|---|---|---|---|
| 1,781,593 | 11/1930 | Montapert | 324/550 |
| 1,989,645 | 1/1935 | Podell | 324/550 |
| 2,023,916 | 12/1935 | Dante | 324/550 |
| 2,588,559 | 3/1952 | Needham | 324/507 |
| 4,525,664 | 6/1985 | Trammell, Sr. | 324/550 |

FOREIGN PATENT DOCUMENTS 0995752 12/1951 France ................................ 324/507

*Primary Examiner*—Maura K. Regan
*Attorney, Agent, or Firm*—Norman B. Rainer

[57] ABSTRACT

A plier-type manual tool for removing and testing cartridge-type fuses is constructed of two pivoted elongated members providing jaw portions and handle portions. The handle portions are fabricated of rigid electrically insulative material. One of the handle portions is a testing handle and has an internal cavity which houses batteries and an indicator device such as a buzzer. Contact posts project from the interior surface of the testing handle in a spaced apart linear array along the length of the handle. Conductors within the handle join the batteries, the posts and buzzer in a partial series circuit. The series circuit is completed when a cartridge fuse having electrical continuity bridges two of the posts.

5 Claims, 1 Drawing Sheet

TOOL FOR PULLING AND TESTING CARTRIDGE-TYPE FUSES

RELATED APPLICATIONS

This application is a continuation-in-part of U.S. patent application Ser. No. 07/619,597, filed Nov. 29. 1990.

BACKGROUND OF THE INVENTION

1. Field of the Invention

This invention relates to electrical tools, and more particularly concerns a combination tool for safely extracting fuses of the cartridge type and testing the extracted fuse.

2. Description of the Prior Art

Cartridge-type fuses are comprised of a circular cylindrical body extending between two metal end caps, and an internal conductor centered within said body and extending between said end caps. The cylindrical body is electrically insulated from said end caps and internal conductor. In use, the fuse is emplaced in a manner such that the end caps are secured by terminals, which are usually spring-loaded.

Tools for gripping the cylindrical body of the fuse, and pulling it away from securement by the terminals have earlier been disclosed. For example U. S. Pat. Nos. 4,314,385 and 4,414,698, concern a device for pulling automobile fuses which generally handle 12 volts of electrical current. Such low voltages involve relatively little hazard. Also, relatively little force is required to extract the fuse from the securing terminals. Accordingly, the construction of such devices is not dictated by the requirements of sturdiness and safety. It is also to be noted that the puller tools of the aforesaid Patents are limited to use with fuses of just one particular cylindrical diameter.

Large cartridge-type fuses, as used in industrial applications, may handle high amperage currents at up to about 600 volts. The handling of such fuses involves considerable risk. A plier-type tool for extracting large fuses is disclosed in U.S. Pat. No. 2,023,916 to Dante. The Dante tool also has provision for testing the fuses, namely testing the continuity of electrical conductivity between the end caps. However, the mode of testing requires that the line voltage be directed through the tool. Such mode of testing is hazardous.

The Dante tool further permits the operator to test the fuse while it is still emplaced within a high voltage electrical circuit. Such testing involves considerable risk to the operator. It also requires considerable knowledge on the part of the operator as to where the test pins should be placed. For example, as shown in FIG. 6 of Dante, the test pins 28 and 29 cannot merely be placed in contact with the metal end caps of an emplaced single fuse, the reason being that this will always show continuity, regardless of the condition of the fuse. Therefore, Dante's tool can only be employed by a skilled electrician.

U. S. Pat. No. 2,588,559 to Needham discloses a battery-operated device for testing the continuity of fuses. In the illustrated embodiment, cartridge fuses of only two different sizes can be tested. This represents a severe limitation of the Needham device because it is often necessary to be able to test cartridge fuses of numerous different sizes. Furthermore, the only reason the Needham device can test two different length fuses is that it is predicted upon use with those styles of cartridge fuses that have a cylindrical body of smaller diameter than the diameter of its end caps. However many styles of fuses have a cylindrical body and end caps of substantially equal diameter, and accordingly could not be tested in multiple sizes by the Needham device.

Devices such as disclosed in U. S. Pat. No. 2,901,294 designed specifically for the testing of fuses, generally have means for contacting the end caps, and an electrical circuit that includes a visual indicator. The manipulation of the testing tool relative to the fuse may be time-consuming, depending upon the exact design of the tool. Furthermore, in those testing devices having lead wires or equivalent extension contact means, there is the possibility that the contact means may inadvertently bridge dangerously high current carriers.

It is accordingly an object of the present invention to provide a tool for safely pulling and testing cartridge-type fuses of various sizes that handle large electrical currents.

It is another object of this invention to provide a tool as in the foregoing object wherein the testing of a pulled fuse can be quickly achieved.

It is still another object of the present invention to provide a tool of the aforesaid nature whose construction requires that the fuse be pulled before testing, thereby thwarting improper and hazardous use of the tool.

It is a further object of this invention to provide a tool of the aforesaid nature which is of sturdy, simple construction amenable to low cost manufacture, and easy to manipulate.

These objects and other objects and advantages of the invention will be apparent from the following description.

SUMMARY OF THE INVENTION

The above and other beneficial objects and advantages are accomplished in accordance with the present invention by a combination tool for pulling and testing cartridge-type electrical fuses, comprising:

a) a pair of rigid elongated members joined by pivot means adjacent one extremity of said members to define long handle insulative portions and short cooperating jaw portions disposed on the opposite side of said pivot means from said handle portions, said handle portions having facing interior surfaces and opposed outer surfaces, and b) testing means disposed in at least one of said handle portions for determining the electrical integrity of a cartridge-type fuse, said testing means comprising a series of contacts in substantially linear array spaced apart along the length of the interior surface of said handle portion, electrical conductor means disposed within said handle portion and communicating with said contacts, at least one battery disposed within said handle portion in series circuit with said contacts, and indicator means activatable by said battery upon completion of a series circuit involving said fuse, contacts, conductor means and battery.

BRIEF DESCRIPTION OF THE DRAWING

For a fuller understanding of the nature and objects of the invention, reference should be had to the following detailed description taken in connection with the accompanying drawing forming a part of this specifica

DESCRIPTION OF THE PREFERRED EMBODIMENT

Figure 1:
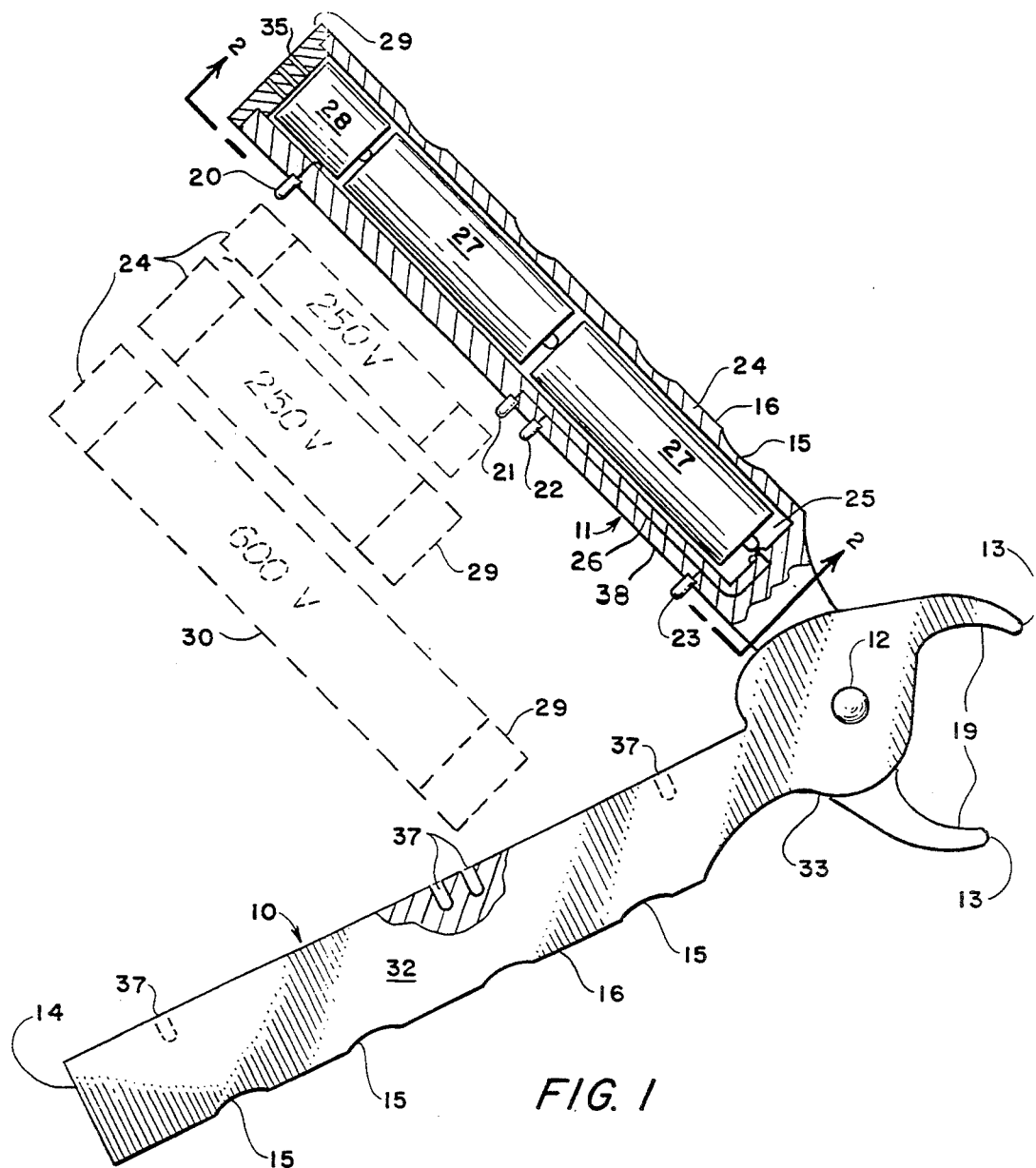
- FIG. 1 is a top plan view of an embodiment of the tool of this invention.
Figure 2:
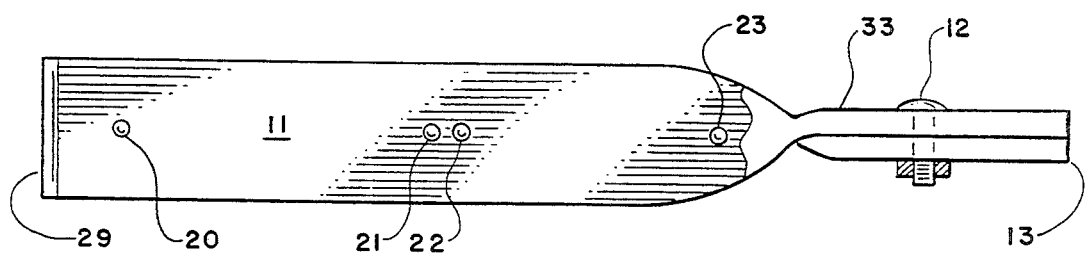
FIG. 2 is a sectional view taken in the direction of the arrows upon the line 2—2 of FIG. 1.

Referring to FIGS. 1-2, an embodiment of the tool of the present invention is shown comprised of rigid elongated members 10 and 11 joined by pivot means in the form of bolt 12 to form a plier structure illustrated in its open state.

Each elongated member has a forward extremity 13, rearward extremity 14, long handle portion 32 of an electrically insulative nature, and a short jaw portion 33. The jaw portions are disposed in facing relationship between forward extremity 13 and pivot bolt 12, and have interactive arcuate gripping surfaces 19. The elongated members may each be of integral monolithic construction, fabricated of electrically non-conductive materials such as engineering grade plastics which may contain reinforcing fillers such as fiberglass.

Each handle portion 32 is of circular cylindrical configuration having outwardly directed outer surface portions 16 provided with indentations 15, to facilitate gripping. It is to be noted, particularly by reference to FIG. 2, that the handle portions are thicker than the corresponding jaw portions. Such construction facilitates scissor-like movement of the handle portions about pivot bolt 12 between an open state shown in FIG. 1, and a closed state wherein arcuate surfaces 19 grip a fuse. The construction is such that, at maximum separation, the handle portions define an angle of about 90 degrees.

The handle portions may range in length between about 6 and 7 inches, measured between rearward extremity 14 and the center of bolt 12. The handle portion of elongated member 11 of the illustrated embodiment contains testing means for determining the electrical integrity or continuity of a cartridge-type fuse. Said testing means includes conductive contacts 20, 21, 22 and 23 protruding from interior surface 38. Contact 20 is positioned in a rearwardmost position on handle portion 32, and is considered a base contact to be touched by fuses of any size, as shown in FIG. 1. Contact 23 is positioned in a forwardmost position on said handle portion, and contacts 21 and 22 are positioned intermediate said contacts 20 and 23 and substantially on a straight line locus therewith. When in such straight line arrangement, it is preferable that contacts 21, 22 and 23 be of incrementally increased height. Such configuration facilitates the testing of cartridge-type fuses 24 of various standardized lengths. Receiving apertures 37 in the interior surface of the opposite handle portion receive said contacts when the handle portions are in contact.

The testing means further includes hollow cavity 25, which houses battery means which may typically be two AA cells 27 placed in series to provide a 3 volt electrical supply, and audible indicator means in the form of buzzer 28. An internally threaded end cap 29 adapted to engage extremity 14 of elongated member 11 provides access to cavity 25 for replacement of said batteries and buzzer. Perforations 35 in cap 29 permit emergence of sound from the handle.

Conductor wires or strips 26, embedded within the plastic, place contacts 21, 22 and 23 in direct series communication with one polarity of said batteries. Said conductors further provide series communication between the opposite polarity of the batteries, the buzzer, and base contact 20.

When testing a fuse 24 having end caps 29 and circular cylindrical body 30, the fuse is held such that one end cap touches base contact 20 and the opposite end cap touches an appropriate contact 21, 22 or 23. When placed in such manner, if the fuse is "good", namely having electrical continuity between said end caps, the fuse completes a series circuit involving wires 26, batteries 27 and buzzer 28. The completed circuit activates said buzzer which indicates to the user that the fuse is good. In alternative embodiments, the indicator means may be in the form of a light instead of or in addition to the buzzer. It is to be noted that there is no way that the tool of the present invention can be manipulates so as to test a fuse still emplaced in a live electrical circuit.

While particular examples of the present invention have been shown and described, it is apparent that changes and modifications may be made therein without departing from the invention in its broadest aspects. The aim of the appended claims, therefore, is to cover all such changes and modifications as fall within the true spirit and scope of the invention.

Having thus described my invention, what is claimed is:

1. A combination tool for pulling and testing cartridge-type electrical fuses, comprising:
   a) a pair of rigid elongated members joined by pivot means adjacent one extremity of said members to define long handle insulation portions and short cooperating jaw portions disposed on the opposite side of said pivot means from said handle portions, said handle portions having facing interior surfaces and opposed outer surfaces, and
   b) testing means disposed in at least one of said handle portions for determining the electrical integrity of a cartridge-type fuse, said testing means comprising a series of contacts in substantially linear array spaced apart along the length of the interior surface of said handle portion and projecting therefrom at progressively increased distances, electrical conductor means disposed within said handle portion and communicating with said contacts, at least one battery disposed within said handle portion in series circuit with said contacts, and indicator means activatable by said battery upon completion of a series circuit involving said fuse, contacts, conductor means and battery the other handle portion having receiving apertures in its interior surface positioned to receive said contacts when the handle portions are in contact.

2. The tool of claim 1 wherein each elongated member is of monolithic construction, fabricated of electrically non-conductive material.

3. The tool of claim 2 wherein said non-conductive material is an engineering grade plastic.

4. The tool of claim 3 wherein the handle portion that contains said testing means is of cylindrical shape, and is provided with an internal cavity that houses said battery and indicator means.

5. The tool of claim 4 having means for providing access to said cavity.

* * * * *